United States Patent [19]

Marnier

[11] Patent Number: 4,746,396
[45] Date of Patent: May 24, 1988

[54] PROCESS FOR THE FLUX SYNTHESIS OF CRYSTALS OF THE KTIOPO₄ POTASSIUM TITANYL MONOPHOSPHATE TYPE

[75] Inventor: Gérard Marnier, Jarville, France

[73] Assignee: Centre National de la Recherche Scientifique, Paris, France

[21] Appl. No.: 889,777

[22] Filed: Jul. 28, 1986

[30] Foreign Application Priority Data

Jul. 26, 1985 [FR] France .................................. 85 11520

[51] Int. Cl.⁴ .............................................. C30B 9/12
[52] U.S. Cl. ................................ 156/623 R; 156/621; 156/622; 156/624; 156/DIG. 70; 156/DIG. 71; 156/DIG. 75; 156/DIG. 81; 423/306
[58] Field of Search .................... 156/621, 622, 623 R, 156/624, DIG. 70, DIG. 71, DIG. 75, DIG. 81; 423/306

[56] References Cited

U.S. PATENT DOCUMENTS

| | | | |
|---|---|---|---|
| 3,901,719 | 8/1975 | Brydges et al. | 156/DIG. 75 |
| 3,949,323 | 4/1976 | Bierlein et al. | 156/DIG. 75 |
| 4,231,838 | 11/1980 | Gier | 156/DIG. 75 |
| 4,305,778 | 12/1981 | Gier | 156/DIG. 71 |

OTHER PUBLICATIONS

Brice, The Growth of Crystals from Liquids, North Holland Publishing Company, 1973, pp. 301–306.
Jacco et al., Flux Growth and Properties of KTiOPO₄, Journal of Crystal Growth, vol. 70 (1984), 484–488.

*Primary Examiner*—John Doll
*Assistant Examiner*—Robert M. Kunemund
*Attorney, Agent, or Firm*—Larson and Taylor

[57] ABSTRACT

The process of synthesis of crystals of the KTP type comprises dissolving a mixture of titanium oxide and of oxides, oxide precursors or salts of the constituents of the desired compounds or of compounds of the KTP type prepared beforehand in at least one alkali metal halide by heating at a plateau temperature of 1100°–650° C., cooling to a temperature close to ambient at a rate lower than about 50° C./h.

17 Claims, 1 Drawing Sheet

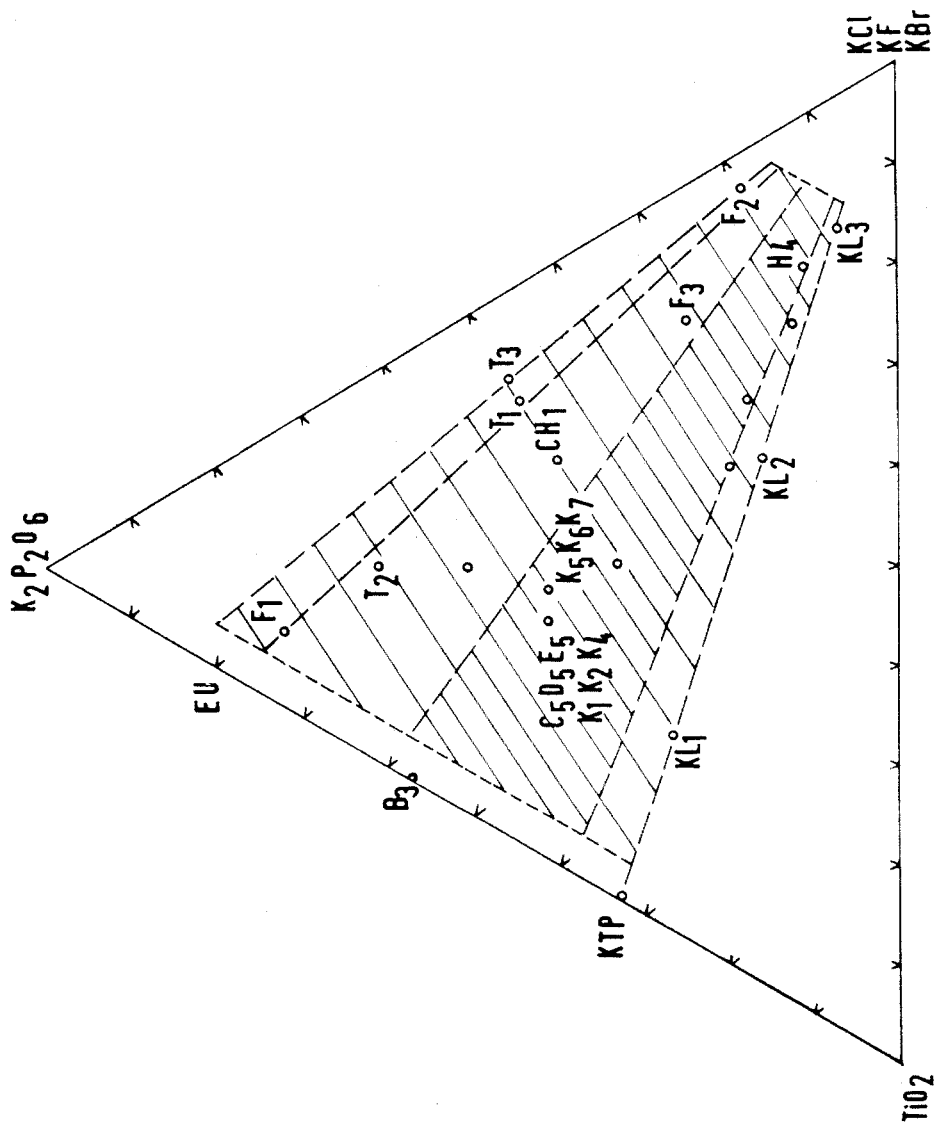

PROCESS FOR THE FLUX SYNTHESIS OF CRYSTALS OF THE KTiOPO₄ POTASSIUM TITANYL MONOPHOSPHATE TYPE

The invention relates to a process for the flux synthesis of crystals of the KTiOPO$_4$ or potassium titanyl monophosphate type.

Potassium titanyl monophosphate KTiOPO$_4$, more commonly called KTP, was obtained by Masse in 1970 by the flux method, starting from TiO$_2$, K$_2$CO$_3$ and (NH$_4$)$_2$HPO$_4$, by following the KTP-KPO$_3$ line in the K$_2$O, TiO$_2$, P$_2$O$_5$ diagram (see Bull. Soc. Fr. Mineral. Cristal. (1971), vol. 94, No. 4, p. 437 to 439).

Subsequent study of this compound has shown that it has nonlinear optical properties, and this renders it of great interest, especially as a frequency doubler. The advantage of the availability of fracture-free, transparent crystals of good quality for applications in optics will be readily appreciated.

In fact, flux methods for preparing them which have been proposed so far do not enable crystals of a satisfactory quality to be obtained, in particular because of their tendency to form glasses. In general, the crystals formed are opalescent and have an appearance of redissolving. At the present time, only the hydrothermal growth synthesis, according to the patents U.S. Pat. No. 3,949,323 and EP No. 022,193 enables centimeter-size crystals to be obtained. However, they are difficult to exploit on an industrial scale, bearing in mind, in particular, the high pressures (of the order of 3000 bars) and temperatures (of the order of 650° C.) employed.

Patent EP No. 04,974 describes a flux-growth process concerning only the ternary diagram K$_2$O or Rb$_2$O, TiO$_2$, P$_2$O$_5$ and excluding the KTP-KPO$_3$ line.

Other authors such as Jacco et al. have published in Journal of Crystal Growth 70 (1984), 484-488 a process for the synthesis of KTP crystals by the flux method by working in the pseudobinary diagram KTP-K$_6$P$_4$O$_{13}$ and by employing a flux modified by the incorporation of additives. These authors are of the opinion that only fluxes containing added PbF$_2$ are suitable but that the introduction of a significant amount of lead into KTP may be harmful to the optical properties.

Jacco et al.'s study of the solubility of KTP in K$_6$P$_4$O$_{13}$ as a function of temperature confirms the inventors' work which shows that KTP crystallizes on its own in a region included between the lines KTP-K$_4$P$_2$O$_7$ and KTP-K$_2$P$_2$O$_6$, this latter line being excluded, since two crystalline phases, KTP and KTi$_2$(PO$_4$)$_3$, are obtained thereon.

Research carried out so far confirms that the crystals obtained in the K$_2$O, P$_2$O$_5$, TiO$_2$ diagram are difficult to obtain because of their pronounced tendency to form glasses and because of the abrupt change in solubility with temperature.

The inventors' work relating to the synthesis of KTP led them to study the crystallization process in accordance with the flux synthesis method. It will be recalled, that, in accordance with the flux synthesis method, that is to say in solutions at a high temperature, the constituents of the material to be crystallized are dissolved in a solvent and the crystallization of the material takes place when the solution becomes supersaturated. The supersaturation may be produced by solvent evaporation, by slow cooling of the solution, or by a transport process in which the solute is transported from a hot region to another, colder region. The chief advantage of this method lies in the formation of crystals at a temperature below the melting point of the material if the latter is noncongruent or if it is characterized by phase transitions.

According to another advantageous aspect, in contrast to the hydrothermal growth method, the growth of crystals takes place in practice with fewer mechanical stresses and thermal stresses.

Nevertheless, various difficulties are encountered in crystallization of this type. These are technical difficulties connected with the quality of the furnaces employed, with temperature control and with the choice of cooling laws. Other difficulties are inherent in the crystallization process whose conditions cannot be satisfactorily determined at the present time using the proposed methods for establishing the solubility curves and determining the crystallization temperatures and the chemical equilibria in the crucible.

The inventors' investigation of this problem has led them to develop a new method which enables them to follow the change in the concentration of the reactants during the crystallization. Based on the results obtained, the inventors have found that, by dissolving the metal oxides or the starting salts, employed according to defined concentrations, and a specified solvent, and by then cooling according to a given process, it is possible to improve the quality of the crystals obtained and to prevent the formation of unwanted compounds such as KTi$_2$(PO$_4$)$_3$.

The purpose of the invention is therefore to provide a new process for the synthesis of crystals of the KTP type, which can be exploited on an industrial scale and resulting in highly-transparent crystals which are especially suitable for applications in optics.

BRIEF DESCRIPTION OF THE DRAWING

The FIGURE is a ternary diagram of TiO$_2$-K$_2$P$_2$O$_6$-KCL or KF or KBr

The synthesis process according to the invention, which comprises the use, in a crucible introduced into a furnace, of a mixture of titanium oxide and of oxides, oxide precursors or salts of the constituents of the required compound or of compounds of the KTP type, prepared beforehand, is characterized in that this mixture or this compound is dissolved in at least one alkali metal halide to be introduced into the crystal, by heating at a plateau temperature of approximately 1100° to 650° C., that the crucible is then cooled to a temperature close to ambient temperature at a rate lower than approximately 50° C./h and that the crystals formed are separated from the glass.

Advantageously, the halides make it possible to limit the number of foreign elements capable of being incorporated in the crystals and of impairing the required optical quality properties. They also make it possible to obtain a solution which has a low viscosity at low temperature, and this enables a satisfactory growth rate to be obtained at low temperature. A plateau temperature of approximately 600° to 800° C. is preferably used.

According to a preferred arrangement of the invention, the composition of the mixture employed in the process is chosen in the TiO$_2$, K$_2$P$_2$O$_6$, KX ternary diagram shown in the single FIGURE, with X denoting F, Cl or Br.

This composition corresponds to the system X(KTP)+(1−x)KX, that is to say, referring to the diagram in question, to the line KTP-KX.

In this system x is between approximately 0.95 and 0.16.

To increase the solubility of KTP in the system, an excess of $K_2P_2O_6$ is added. The resulting system corresponds to the formula:

$$u(KTP) + yK_2P_2O_6 + zKX$$

where $3u + y + z = 1$,
y and z being the molar fractions of $K_2P_2O_6$ and KX, The excess y of $K_2P_2O_6$ varies typically in the range from 0 to 0.725 and preferably between 0.1 and 0.60 and x varies from 0.05 to 0.83, and preferably between 0.05 to 0.60.

The temperature of the beginning of crystallization is a function both of y and of z. A low temperature of the beginning of crystallization (in the region of 700° C.) may be obtained with a small excess of KCl and a high value of y or with a small excess of $K_2P_2O_6$, but a high value of z (see zone $F_1$, $F_2$ in the diagram).

According to an additional arrangement the excess of $K_2O$ relative to $P_2O_5$ advantageously varies from approximately 1 to 2, as a molar fraction.

According to an embodiment of the invention, the crystallization is produced by isothermal evaporation of the halide, advantageously with the establishment of a thermal gradient.

In another embodiment of the invention, the crystal growth is obtained by the use of both isothermal evaporation and slow cooling with a thermal gradient in the crucible.

The rate of cooling is advantageously of the order of 0.1° C./h to 5° C./h from the plateau temperature to approximately 600° C. and then down to ambient temperature at a rate not exceeding approximately 50° C./h, especially of the order of 10° to 20° C./h, which makes it possible to avoid fracture of the crystals due to stresses in the glass.

According to an additional arrangement, the crystallization stage is performed with agitation of the mixture. Satisfactory results are obtained with alternating crucible rotation speeds of 0 to 350 revolutions/min.

According to a preferred embodiment of the invention, the initial powder mixture is introduced into a crucible made of a material which is inert towards the reactants, which is, in particular, made of a precious metal, especially platinum.

In order to obtain a maximum filling of the crucible, the introduction of the mixture is carried out in several stages and comprises a dehydration operation followed by a densifying operation.

The dehydration is carried out more especially at temperatures of the order of 300° C. and the densifying at temperatures of approximately 800° C.

The crucible is then introduced into a furnace whose temperature is controlled and programmed and which is heated to the selected plateau temperature, situated between approximately 1100° and 600° C.

The plateau is maintained for approximately 25 to 150 h, the crucible being advantageously subjected to agitation, using a speed of rotation which can vary with time from 0 to 300 revolutions/min.

The furnace is heated to a temperature of 600° to 750° C. at a rate of 0.1° to 5° C./h, and then cooled to ambient temperature at a rate of less than 50° C./h, advantageously of th order of 10° to 20° C./h.

The crystals obtained are recovered by dissolving the flux in hot water.

According to another alternative form of embodiment, a seed is introduced after homogenization of the solution, into the top part of the crucible, which part is placed in a thermal gradient varying from approximately 1° to 10° C./cm.

The crystal is withdrawn after several hundred hours.

The use of these arrangements in experiments on the synthesis of KTP in crucibles 70 mm in diameter and 140 mm in height makes it possible to obtain crystallization yields of up to 75% based on titanium oxide, with development of crystals of up to 3 cm$^3$.

Similar experiments in crucibles of smaller size (for example of the order of 15 mm in diameter and 50 mm in height) result in crystals of several millimeters in side length, and of high transparency, especially when KF is used.

The use of the above arrangements makes it possible to obtain a high yield of KTP or isotypic crystals of high purity and thus to exploit the optical properties of these crystals, especially for frequency doubling and in electro-optics as a parametric amplifier oscillator or modulator as described in U.S. Pat. No. 3,949,323.

Three materials are chiefly used at the present time for frequency doubling: KDP, $LiNbO_3$ and BNN. These materials do not have all the required qualities, namely: high nonlinearity, excellent power behaviour, good optical quality and ease of operation. It appears that KTP has all the properties; in particular, it is not photorefractive and can therefore be subjected to high powers without any resultant change in its refractive indices.

Since KTP is transparent in the 0.35 μm–4.5 μm wavelength range, it is advantageously used as a frequency doubler for wavelengths greater than 0.9 μm and especially for doubling the YAG. Nd. Lasers, thus making it possible to convert 1.064 μm into 0.532 μm, a visible wavelength close to the principal lines of the argon laser. The frequency doubling is approximately 50%.

The combination YAG. Nd.—KTP offers the advantage of forming an alternative to the rare-gas lasers.

Such a source offers advantages from the standpoint of both compactness and reliability.

It is possible to envisage replacing low-power lasers such as the He-Ne laser for applications in research and metrology. This implies the possibility of producing the doubling in a thin layer of a nonlinear crystal.

In addition, for medical applications, it is advantageous to have available a system with two wavelengths, one in the infrared, the other in the visible.

The above arrangements can be advantageously applied to the synthesis of RbTP by using the Rb halide and to the various terms of the solid solutions $K_aRb_{(1-a)}TP$ with $0 \leq a \leq 1$.

The atomic fractions of K and of Rb in the crystals obtained depend on the concentrations of $K_2P_2O_6$ and $Rb_2P_2O_6$, as well as on the concentrations of KX and RbX.

To illustrate the invention, examples are added hereinafter, which relate to the synthesis of crystals of KTP (Examples 1 to 8) and of RbTP-KTP (Examples 9 and 10).

The starting products used in the experiments described correspond to the following products marketed by Merck:

$TiO_2$ titanium oxide (ref. 808)

KH$_2$PO$_4$ potassium dihydrogen phosphate AR (ref. 4873)

K$_2$HPO$_4$ dipotassium hydrogen phosphate AR (ref. 5104)

KCl potassium chloride AR (ref. 4936)

KF potassium fluoride AR (ref. 4994)

KBr (ref. 4904)

RbCl (ref. 7622)

RbOH Veutron (ref. 16608)

NH$_4$H$_2$PO$_4$ Prolabo (ref. 2130529)

The crucibles used were pure platinum crucibles from La Compagnie des métaux précieux.

The experimentes carried out are shown on the diagram in the single FIGURE. The hatched zone corresponds to the extended crystallization region of KTP in the TiO$_2$, KX, K$_2$P$_2$O$_6$ system with X denoting Cl, F or Br.

In the singly-hatched zone bounded by F$_1$, T$_3$, F$_2$, F$_3$ and B$_3$, the crystallization temperatures decrease down to 600° C. (T$_3$). Spontaneously-nucleated growth produces only small crystals and evaporation becomes slow or nil (below 850° C. for KF and below 750° C. for KCl and KBr). The crystallization yield becomes low as one approaches F$_1$ and F$_2$. As a result, this region is particularly suitable for growth by means of transport on seed. The latter is then introduced into the upper parts of the path, colder than the bottom of the crucible (a gradient of 1° to 10° C./cm), the crucible bottom being used as a reserve. The rates of growth of the seed vary (from 0.1 A/s to 100 A/s) depending on the composition, the plateau temperature and the thermal gradient in the crucible. The tests carried out have made it possible to demonstrate that the linear speed is constant. 3-cm$^3$ crystals have been obtained in this manner.

The KTP-KCl line corresponds to the dissolution of KTP in the halide. Experiments KL1, KL2 and KL3 (see Example 5 below) show that KTP is poorly soluble in KCl, and this makes it necessary to work at a high temperature: 1020° C. in the case of KL1 and KL2, 900° C. in the case of KL3.

The composition region which is the most suitable for growing KTP crystals by spontaneous nucleation without the formation of contaminant compounds corresponds to the doubly-hatched region. The maximum temperatures vary from 1050° C. to 900° C.

The control of the growth process by slow cooling and especially by evaporation is tricky. The high crystallization temperatures give rise to a high probability of incorporation of additives and to major technical difficulties.

The crystallization yield is high and the formation of contaminant compounds such as rutile is avoided at high temperatures in the mixtures close to KTP, as is the formation of KTi$_2$(PO$_4$)$_3$ in mixtures close to the eutectic (EU).

Some experiments carried out in the TiO$_2$-K$_4$P$_2$O$_7$-KCl diagram result in KTP crystals but, the molar solubility of KTP in K$_4$P$_2$O$_7$ is lower than in K$_2$P$_2$O$_6$ at a given temperature and, consequently all the more, the solubility on a mass basis and the crystallization yield.

EXAMPLE 1

Synthesis of KTP crystals (experiment H4)

The following starting mixture is introduced into an open platinum crucible 15 mm in diameter and 45 mm in height:

2.85 g KH$_2$PO$_4$+1.21 g TiO$_2$+5.04 g KCl.

The mixture is introduced in several stages to obtain an optimum filling of the crucible.

A portion of the mixture is dehydrated at 250° C. and then densified at 800° C. The crucible is then recharged with another portion of the mixture and again dehydrated and densified until the crucible has been filled.

The crucible, partially closed or otherwise with a thin sheet of platinum, is introduced into the furnace. A furnace which is controlled and programmed for temperature and equipped with a device for agitating the crucible using accelerated rotation, as described by Elwell et al. in Academic Press, 1975, is used.

The furnace is heated to 1100° C. over several hours. This temperature plateau is maintained for 96 hours. The speed of rotation of the crucible agitator ranges from 0 to 200 rev/min over approximately 3 min and is then decelerated in the same manner and reversed. The initial rate of evaporation of the halide is of the order of 0.1 q/cm$^2$/h.

The furnace is then cooled to 560° C. at 5° C./h and then to ambient temperature at 15° C./h.

Weighing of the crucible after the experiment shows that KCl has evaporated almost completely.

The crystals are extracted by dissolving the glass in hot water. Two groups of crystals can be very clearly distinguished; one of transparent "coarse crystals" with a side length of 2 to 3 mm, originating from growth by evaporation, the other, consisting of very small crystals with a side length of 0.1 mm, produced by slow cooling.

EXAMPLE 2

(experiment C5)

The method of Example 1 is followed, but using the following powder mixture;

9.53 g KH$_2$PO$_4$+2.39 g TiO$_2$+1.51 g KCl

The crucible is closed with a platinum sheet, introduced into the furnace and heated at 1110° C. for 70 h. The rate of cooling is 1.5° C./h down to 750° C., followed by a cooling down to ambient temperature at 20° C./h.

Transparent KTP crystals with a side length of 4 to 6 mm are obtained in the too third of the crucible and a large quantity of small crystals (0,1 mm) in the bottom of the crucible.

An experiment identical with C5 but with a crucible 35 mm in diameter and 50 mm in height, and an initial mixture 5 times greater in quantity, results in transparent KTP crystals with a maximum size of 10×5×5 mm. The overall mass yield of KTP is 30% (experiment D5).

EXAMPLE 3

(experiments K1, K2 and K4)

The method of Example 1 is used, with KCl replaced by KF (experiment K1) and by KBr (experiment K4). KCl is used in experiment K2.

The starting mixtures are as follows, respectively:

K1 9.53 g KH$_2$PO$_4$+2.39 g TiO$_2$+1.19 g KF

K2 9.53 g KH$_2$PO$_4$+2.39 g TiO$_2$+1.52 g KCl

K4 9.53 g KH$_2$PO$_4$+2.39 g TiO$_2$+2.4 g KBr.

The best-looking crystals, which grow up to 4 to 5 mm, are obtained in experiment K1.

EXAMPLE 4

(experiments K5, K6 and K7)

The experiments K5, K6 and K7 which are carried out correspond to the preceding ones with an open crucible for a slightly greater dilution of $TiO_2$. The maximum temperature is 1020° C. for 100 h and then cooling at 2° C./h takes place down to 620° C. and at 15° C./h down to ambient temperature.

The compositions of the starting mixtures are as follows:

K5: 9.8 g $KH_2PO_4$+2.2 g $TiO_2$+1.77 g KCl

K6: 9.8 g $KH_2PO_4$+2.2 g $TiO_2$+1.38 g KF

K7: 9.8 g $KH_2PO_4$+2.2 g $TiO_2$+2.64 g KBr

Very clear crystals, several millimeters in size are obtained in the 3 crucibles.

EXAMPLE 5

(experiment KL1)

The same conditions are used as in K5, k6 and k7, with the following mixture:

9.8 g $KH_2PO_4$+5.59 g $TiO_2$+1.05 g KF+0.91 g KCl.

Alternatively, the initial mixture is:

10.67 g KTP+1.05 q KF+0.91 g KCl

Small transparent crystals are obtained in addition to the presence of a few rutile crystals.

EXAMPLE 6

(experiment E5)

The operation is performed in a closed crucible 60 mm in diameter and 60 mm in height under conditions close to those reported for Example 2, but with a total charge of 400 g instead of 13.4 g in Example 2. Crystals 10×10×17 mm in size are obtained.

EXAMPLE 7

An experiment is carried out in the $K_4P_2O_7$-$TiO_2$-KCl diagram under the same conditions as in Example 2 with an initial mixture of the composition:

10.45 g $KH_2PO_4$+4.79 g $TiO_2$+5.22 g KCl.

Transparent crystals with a side length of 2 to 3 mm are obtained.

EXAMPLE 8

Synthesis of KTP crystals with the use of seed (experiment CH1).

225.80 g $KH_2PO_4$+32.40 g $TiO_2$+80.90 g KCl are introduced into a crucible 60 mm in diameter and 70 mm in height. The furnace is heated to a temperature of 1000° C., which is maintained for 150 h. The gradient is 2° C./cm and then the seed is introduced. Cooling down to 700° C. is applied at a rate of 1° C./h and then to ambient temperature at 20° C./h.

The mean evaporation of halide is 38 q.

40 g of KTP crystals are obtained with a 3-$cm^3$ crystal grown on the seed.

In another experiment of this type (experiment T1), the operation is carried out in a crucible 25 mm in diameter and 60 mm in height, using the following initial mixture:

40.27 g $KH_2PO_4$+3.0 g $TiO_2$+11.18 g KCl.

A plateau temperature of 640° C. is used, and a 3° C./cm gradient. A 200-mg seed is introduced after 120 h. The linear rate of growth is 5 Å/s. In the final phase, the crystal removed has {100} faces 5 mm in width instead of 0.1 mm at the beginning.

Several experiments of this type: T2 and T3, carried out, respectively, at 740° C. and 600° C. with gradients of up to 10° C./cm have enabled the linear growth speed to be varied from 0.1 Å/s to 40 Å/s and made it possible to demonstrate that the final morphology of the crystal depends on growth conditions and on the quality of the seed introduced.

EXAMPLE 9

Synthesis of $K_aRb_{1-a}TP$ crystals (experiment KR5) $0 \leq a \leq 1$.

The following starting mixture is introduced into a platinum crucible 25 mm in diameter and 60 mm in height: 16.3 g $KH_2PO_4$+12.3 g RbOH+7.99 g $TiO_2$+13.8 g $NH_4H_2PO_4$+4.47 g KCl+7.255 g RbCl.

The furnace is heated to 869° C. and this temperature is maintained for 50 hours. A slow cooling down to 550° C. is applied at 2° C./h and then down to ambient temperature at 20° C./h.

Clear crystals with a 5 to 6 mm side length are obtained, with the composition a=0.6. The compositions a=0.21 and a=0.77 have also been prepared.

EXAMPLE 10

Synthesis of RbTP crystals

By operating under the conditions of Example 9, crystals with a side length of up to 10 mm are obtained. Study and characterization of the crystals of KTP and of $K_aRb_{(a-1)}TP$.

Their identification was performed by means of X rays, using the rotating crystal and Laue method, and using the Castaing electron microprobe.

The investigation with an optical goniometer shows that the morphology of the millimeter-size crystals almost always consists of the following forms (corresponding to those described by Bierlein et al. in U.S. Pat. No. 3,949,323).

pinacoid {100}
prism {210}
dihedra {201}$_{1,2}$
dihedra {011}$_{1,2}$

The morphological study shows that, depending on the growth process employed, depending on the initial composition of the solution and depending on the crystallization temperature, it is possible to modify the relative growth rates of the faces, for example those of faces [100], [201] and [101], which makes the crystals easier to orientate and permits easier and more efficient cutting.

Study of the equilibrium diagrams shows that the coefficient of partition of K and of Rb between the liquid phase and the solid phase remains close to 1 for any solid solution composition $K_aRb_{1-a}TP$.

Analysis of the laser spectrometry (LAMMA) traces shows that the impurities depend directly on the purity of the initial products, but also on the crystallization temperature and the rate of growth. The halogen present as a major element in the solution is found in trace quantities in the crystals (from 100 to 1000 ppm), in a quantity similar to that of $OH^-$, whereas in the hydrothermal growth synthesis processes, the quantity of $OH^-$ is higher.

Studies of X topography and of diffraction line width in synchrotron radiation show evidence of a high crystalline perfection, the disorientation being less than 27" of arc.

The study of the temperature of disappearance of the double beam, using powders of KTP, RbTP and of several terms of the solid solution $K_aRb_{1-a}TP$, confirms the existence of a crystalline transition temperature at a high temperature in the case of KTP (936° C.) and RbTP (800° C.), demonstrated by Yanovskii et al., V.K. Physica Statu Solidi (A) Vol 93. p 665-688, 1986. It is shown that this transition temperature varies in proportion to the composition.

The power behaviour is qualitatively comparable to that indicated in particular by Zumsteq et al. in J. Appl. Phys. 47 (1976) and Yao et al. in J. Appl. Phys. 55, (1984), 65.

These results clearly demonstrate the advantage of the methods of growing KTP and isotypic crystals at temperatures significantly below 800° C.

Several KTP crystals have been cut for the frequency doubling (1.06 μm 0.53 μm) of type II ($\theta=0$, $\phi=26°$). The maximum useful length is 5 mm. The value of the phase matching thermal width is 15 deg. cm. All the crystals tested show a thermal variation of the doubled intensity, characteristic of good-quality crystals.

I claim:

1. An improved flux process for making crystals selected from the group consisting of KTP, $K_aRb_{1-a}TP$ with $0 \leq a \leq 1$ and RbTP comprising:
   1-forming a flux composition by combining (a) titanium oxide, (b) oxides, oxide precursors or salts of the constituents of said KTP, $K_aRb_{1-a}TP$ or RbTP compound, or said KTP, $K_aRb_{1-a}TP$ or RbTP compound prepared beforehand, the proportions of said compounds being such that the ratio of the molar fraction of alkali oxide and of the molar fraction of $P_2O_5$ is equal to 1 or comprised between 1 and 2, (c) a halide flux selected from Cl, F or Br of the alkali metal constituent of said KTP, $K_aRb_{1-a}TP$ and RbTP compound, the proportions of (a), (b) and (c) being such that a low viscosity mixture is obtained at a temperature of 600°-800° C., that the formation of $K(Ti)_2(PO_4)_3$ is avoided, and that when the molar fraction of alkali oxide is different from the molar fraction of $P_2O_5$ the weight amount of said halide flux is higher than 50% with respect to $K_2O$ and $P_2O_5$;
   2—heating the mixture of (a), (b) and (c) to a plateau temperature of 600° to 1100° C.;
   3—cooling the mixture to approximately ambient temperature at a rate less than approximately 50° C./h; and
   4—separating the KTP, $K_aRb_{1-a}TP$ and RbTP compound crystals from the vitreous material formed during the process.

2. The process of claim 1, wherein the mixture of step 1 results in the formation of KTP as solute and a solvent composed of $K_2P_2O_6$ and KX.

3. The process of claim 2, wherein the flux composition is slected within the ternary phase diagram $TiO_2$, $K_2P_2O_6$, KX wherein X is Cl, F or Br.

4. The process of claim 3, wherein the flux composition results in the formation of KTP as solute and KX as solvent, according to the formula:

$$x(KTP)+(1-x)KK$$

wherein x is the molar fraction of KTP and approximately 0.95 to 0.16.

5. The process of claim 3, wherein excess $K_2P_2O_6$ is provided in the mixture corresponding to the system:

$$u(KTP)+y(K_2P_2O_6)+z(KX)$$

wherein $3u+y+z=1$, y and z being the molar fractions of $K_2P_2O_6$ and of KX in the system, the excess y of $K_2P_2O_6$ varying from 0 to 0.725 and x varying from 0.05 to 0.83.

6. The process of claim 5, wherein excess y of $K_2P_2O_6$ is 0.10–0.60 and x is 0.05 to 0.60.

7. The process of claim 1, wherein crystallization of the KTP, $K_aRb_{1-a}TP$ and RbTP compound is obtained by isothermal evaporation of the halide.

8. The process of claim 7, wherein the initial rate of evaporation of the halide is 0.1 g/cm²/h.

9. The process of claim 1, wherein a temperature gradient of approximately 1° to 10° C./cm is provided in the mixture.

10. The process of claim 1, wherein a seed is introduced into the mixture and a temperature gradient of approximately 1° to 10° C./cm is provided in said mixture.

11. The process of claim 1, wherein the mixture is cooled in step (3) at a rate of approximately 0.1° to 5° C./h from the plateau temperature down to approximately 600° C. and then down to ambient temperature at a rate not exceeding 50° C./h.

12. The process of claim 1, wherein the amount of KF added in the initial mixture is of 65% in weight with respect to the solvent, when the ratio of the initial molar fractions of the alkali oxide and of $P_2O_5$ is between 1 and 2.

13. The process of claim 1, wherein $K_aRb_{1-a}TP$ with $0 \leq a \leq 1$ is prepared by using KCl and RbCl.

14. The process of claim 1, wherein the compound is RbTP and said halide is RbCl.

15. The composition consisting of the system $x(KTP)+(1-x)KX$, with x included between approximately 0.95 and 0.16, formed just prior to the cooling step of claim 1.

16. The composition consisting of the system $u(KTP)+y(K_2P_2O_6)+zKX$, y varying from 0 to 0.725 and z varying from 0.05 to 0.83, $3u+y+z$ being equal to 1, formed just prior to the cooling step of claim 1.

17. Composition according to claim 16, wherein y varies from 0.10 to 0.60 and z from 0.05 to 0.60.

* * * * *